(12) United States Patent
Lee et al.

(10) Patent No.: US 12,676,186 B2
(45) Date of Patent: Jul. 7, 2026

(54) MEMORY DEVICE

(71) Applicant: Taiwan Semiconductor Manufacturing Company, Ltd., Hsinchu (TW)

(72) Inventors: Cheng Hung Lee, Hsinchu (TW); Chien-Yu Huang, Hsinchu (TW); Chia-En Huang, Hsinchu (TW); Yen-Chi Chou, Hsinchu (TW); Shao Hsuan Hsu, Hsinchu (TW); Tzu-Chun Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 258 days.

(21) Appl. No.: 18/493,553

(22) Filed: Oct. 24, 2023

(65) Prior Publication Data

US 2025/0131959 A1      Apr. 24, 2025

(51) Int. Cl.

| | |
|---|---|
| *G11C 11/00* | (2006.01) |
| *G11C 5/06* | (2006.01) |
| *G11C 11/418* | (2006.01) |
| *H10B 10/00* | (2023.01) |
| *H10D 30/01* | (2025.01) |
| *H10D 30/62* | (2025.01) |
| *H10D 84/85* | (2025.01) |
| *H10W 20/41* | (2026.01) |
| *H10W 20/42* | (2026.01) |

(52) U.S. Cl.
CPC ............ *G11C 11/418* (2013.01); *G11C 5/063* (2013.01); *H10B 10/12* (2023.02); *H10D 30/024* (2025.01); *H10D 30/6211* (2025.01); *H10D 84/853* (2025.01); *H10W 20/42* (2026.01); *H10W 20/435* (2026.01)

(58) Field of Classification Search
CPC ....... G11C 11/418; G11C 5/063; H10B 10/12; H10D 30/6211; H10D 84/853; H10D 30/024; H01L 23/5226; H01L 23/5283
USPC .......................................... 365/154
See application file for complete search history.

(56) References Cited

U.S. PATENT DOCUMENTS

| | | | |
|---|---|---|---|
| 5,886,942 A | 3/1999 | Akita | |
| 9,870,979 B2 * | 1/2018 | Batra ...................... | H01L 25/50 |
| 10,332,893 B2 * | 6/2019 | Nelson ................... | H10B 10/18 |
| 11,270,998 B2 * | 3/2022 | Wang ..................... | H10D 88/01 |
| 11,887,654 B2 * | 1/2024 | Kim ....................... | G11C 11/4085 |
| 11,984,384 B2 * | 5/2024 | Lin ....................... | H01L 25/0652 |

(Continued)

FOREIGN PATENT DOCUMENTS

| | | | | | |
|---|---|---|---|---|---|
| CN | 107924920 A | * | 4/2018 | ........... | G11C 11/419 |
| JP | 2004103179 A | * | 4/2004 | ............. | G11C 11/15 |

*Primary Examiner* — Viet Q Nguyen
(74) *Attorney, Agent, or Firm* — Merchant & Gould P.C.

(57) ABSTRACT

A memory circuit includes a substrate with a front side and a back side opposite the front side. An interconnect structure is situated on or over the substrate and has first and second metal layers and a via electrically connecting the first and second metal layers. A word line driver circuit is configured to output a word line enable signal to a word line of a memory array. The word line driver circuit has an inverter circuit configured to receive a word line signal, and an enable transistor electrically connected to an output of the inverter circuit by a metal line that includes the first metal layer, the second metal layer, and the via.

20 Claims, 10 Drawing Sheets

(56)     References Cited

U.S. PATENT DOCUMENTS

| | | | |
|---|---|---|---|
| 12,014,801 B2 * | 6/2024 | Zhao | H10B 12/50 |
| 2004/0100835 A1 * | 5/2004 | Sugibayashi | G11C 11/16 |
| | | | 365/200 |
| 2009/0196115 A1 * | 8/2009 | Agari | G11C 11/417 |
| | | | 365/230.06 |
| 2010/0290295 A1 * | 11/2010 | Moriwaki | G11C 8/08 |
| | | | 365/191 |
| 2011/0255353 A1 * | 10/2011 | Fukushima | G11C 7/04 |
| | | | 365/191 |
| 2013/0339571 A1 * | 12/2013 | Cernea | G11C 5/025 |
| | | | 711/102 |
| 2016/0064056 A1 * | 3/2016 | Kim | G11C 7/02 |
| | | | 365/189.11 |
| 2020/0152249 A1 * | 5/2020 | Kawamura | G11C 7/12 |
| 2021/0082496 A1 | 3/2021 | Mathur et al. | |
| 2022/0037337 A1 * | 2/2022 | Wang | G11C 8/14 |
| 2023/0061343 A1 | 3/2023 | Chen et al. | |
| 2023/0260571 A1 * | 8/2023 | Chang | G11C 11/4085 |
| | | | 365/230.06 |
| 2023/0290840 A1 * | 9/2023 | Akkaya | H10D 84/83 |
| 2024/0008259 A1 * | 1/2024 | Sharma | H10B 12/36 |
| 2024/0251540 A1 * | 7/2024 | Lin | H10B 10/12 |
| 2024/0312492 A1 * | 9/2024 | Chung | G11C 11/412 |

* cited by examiner

MEMORY DEVICE

BACKGROUND

A common type of integrated circuit memory is a static random access memory (SRAM) device. A typical SRAM memory device has an array of memory cells. In some examples, each memory cell uses six transistors connected between an upper reference potential and a lower reference potential (typically ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line to control access to the memory cell during read and write operations by selectively connecting the cell to its bit lines. In a read operation, for example, the memory cell bit lines are precharged to a predefined threshold voltage. When the word line is enabled, a sense amplifier connected to the bit lines senses and outputs stored information.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
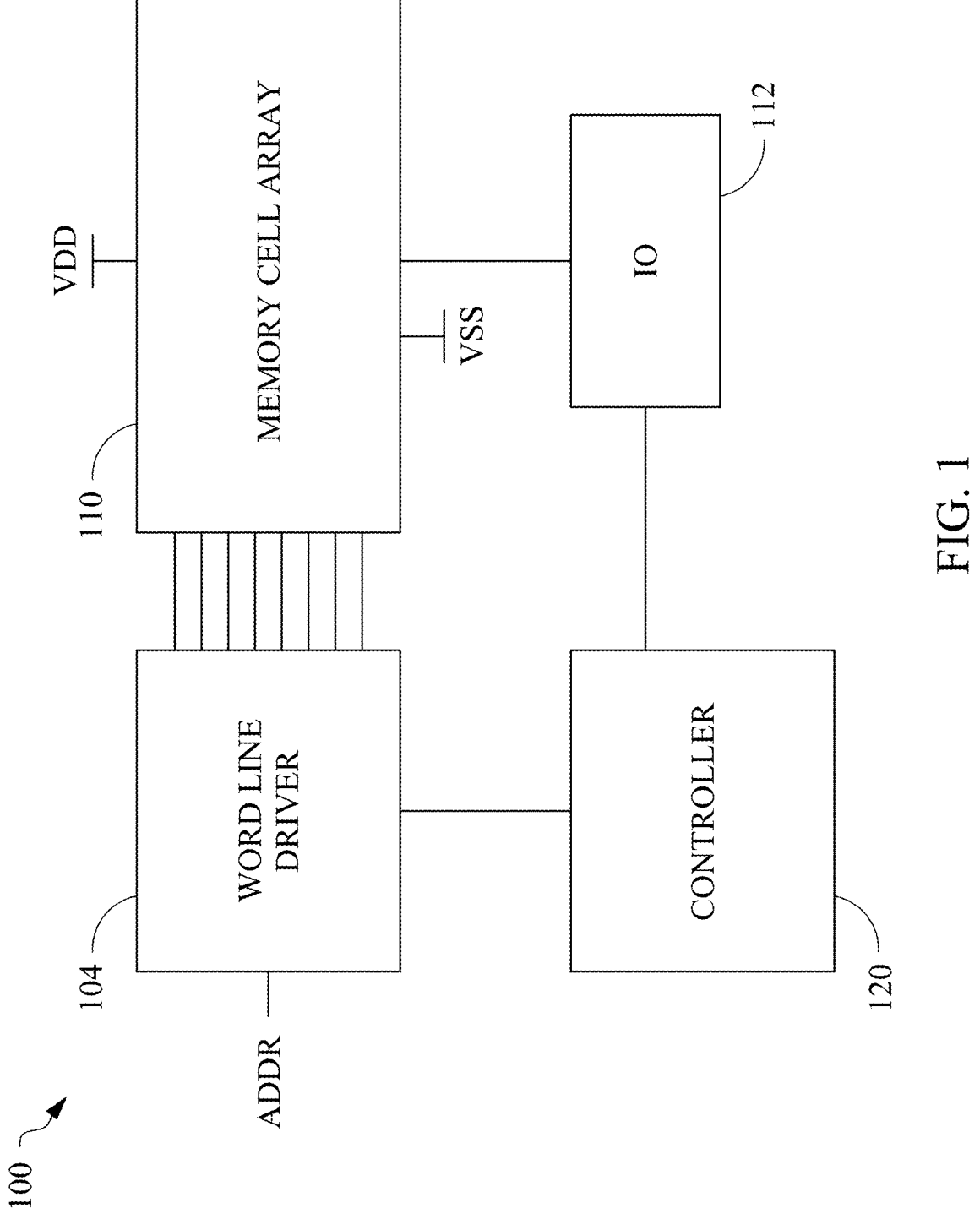
FIG. 1 is a block diagram illustrating an example of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various disclosed embodiments relate to a word line driver circuit for an SRAM memory that provides memory read assist, including word line suppression to improve the memory cell static noise margin (SNM), while also providing power reduction and performance improvements even as temperature varies. The driver circuit includes an added resistance formed by an extended metal interconnection line that connects components of the word line driver circuit to a word line. In some examples, the metal line is formed in multiple metal layers and/or interconnect structures to provide an added length of the metal line. The longer metal line increases resistance, suppresses the word line voltage, while also improving performance at high and low temperatures.

FIG. 1 is a block diagram illustrating an example of a memory device 100 in accordance with aspects of the present disclosure. In the illustrated embodiment of FIG. 1, the memory device 100 includes a memory cell array 110 that includes an array of memory cells. In examples disclosed herein, the memory cells are SRAM cells, though other implementations are possible, such as dynamic random access memory (DRAM) cells. The memory array 110 is connected between an upper reference voltage terminal VDD and a lower reference voltage terminal VSS (typically ground). The memory device 100 further includes an input/output (IO) block 112 configured to read and write data from and to the memory array 110. A word line driver 104 outputs row select signals to select rows of memory cells based on a received address signal ADDR for reading or writing data. A control block 120 is connected to the word line driver 104 and IO block 112. Although in the illustrated embodiment of FIG. 1, each component is shown as a separate block for the purpose of illustration, in some other embodiments, some or all of the components shown in FIG. 1 may be integrated together.

In some examples, each memory cell uses six transistors connected between the upper reference potential VDD and the lower reference potential VSS such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line to control access to the memory cell during read and write operations by selectively connecting the cell to its bit lines. In a read operation, when the appropriate word line is enabled by the word line driver 104, a sense amplifier of the IO block 112 connected to the bit lines senses and outputs stored information.

Figure 2:
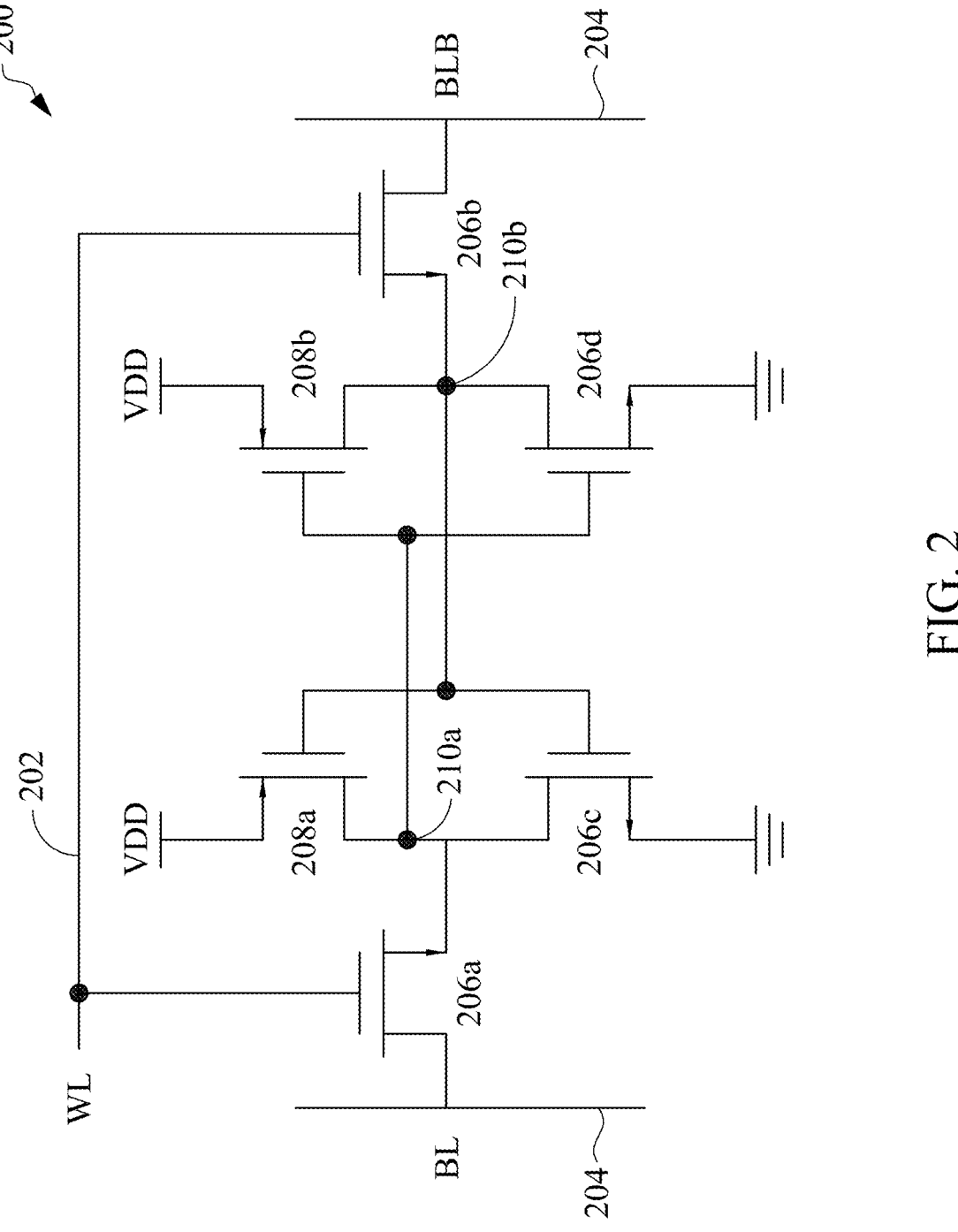
FIG. 2 is a circuit diagram illustrating an example of an SRAM memory cell in accordance with some embodiments.

FIG. 2 illustrates an example of a memory cell 200 of the memory cell array 110 shown in FIG. 1. The memory cell 200 is connected to a word line 202 and complementary bit lines BL 203 and BLB 204. The memory cell 200 includes PMOS transistors 208a-b and NMOS transistors 206a-d. The transistors 208a and 206c are coupled to one another and positioned between the supply voltage VDD and ground to form an inverter. Similarly, the transistors 208b and 206d are coupled between VDD and ground to form a second inverter.

The two inverters are cross-coupled to each other. An access or "pass gate" transistor 206a connects the output of the first inverter to the bit line BL 203 in response to a word line enable signal WL output by the word line driver 104. Similarly, the access transistor 206b connects the output of the second inverter to the bit line bar 204. The word line 202 is attached to the gate controls of the access transistors 206a and 206b to selectively couple the outputs of the inverters to the bit lines 203, 204 during read/write operations in response to the word line driver 104 shown in FIG. 1. During a read operation the inverters drive the complementary voltage levels at the bit lines 203, 204.

The cross coupled inverters of the memory cell 200 provide two stable voltage states denoting logic values 0 and 1. Metal-Oxide Semiconductor Field Effect Transistors (MOSFETs) are typically used as the transistors in the memory cell 200. In some embodiments more or fewer than 6 transistors may be used to implement the memory cell 200.

Figure 3:
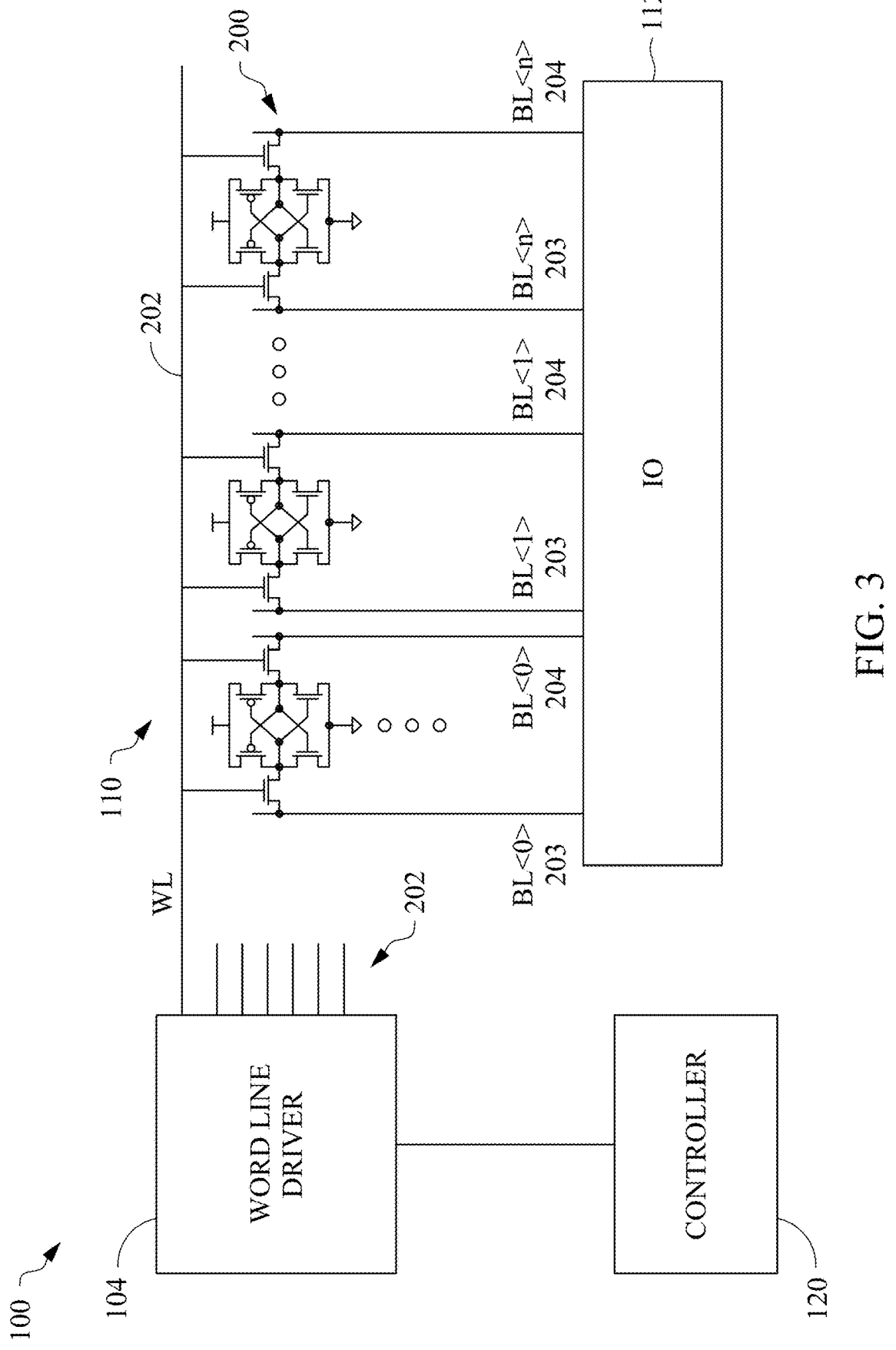
FIG. 3 is a circuit diagram illustrating further aspects of the memory device shown in FIG. 1 in accordance with some embodiments.

FIG. 3 illustrates further aspects of the memory device 100. In some embodiments, the memory cell array 110 includes a plurality of the memory cells 200 arranged in a column-row configuration in which each column has a bit line 203 and a bit line bar 204, and each row has a word line 202. More specifically, the bit lines 203,204 of each column are respectively coupled to a plurality of the memory cells 200 that are disposed in that column, and each memory cell 200 in that column is arranged on a different row and coupled to a respective (different) word line 202. That is, each memory cell 200 of the memory cell array 110 is coupled to a bit line 203 of a column of the memory cell array 110, a bit line bar 204 of the column of the memory cell array 110, and a word line 202 of a row of the memory cell array 110. In some embodiments, the bit lines 203 and bit lines bar 204 are arranged in parallel vertically and the word lines 202 are arranged in parallel horizontally (i.e., perpendicular to the bit lines 203, 204. In the example of FIG. 3, there are n columns and m rows of memory cells 200 in the array 110.

In a read cycle of some embodiments both bit lines 203, 204 are precharged to a high (logic 1) voltage, which is typically at or near the VDD voltage. In response to an enable signal output by the control block 120, word line signals WL are output by the word line driver 104 to select the desired word lines 202 of the memory cells 200. The asserted word lines 202 enable the access transistors 206a, 206b of the memory cells 200 coupled to the selected word lines 202. This causes the voltage signal on one of the bit lines 203, 204 to slightly drop. The bit lines 203, 204 will then have a small voltage difference between them. A sense amplifier of the IO block 112 will sense which of the bit lines 203, 204 has the higher voltage and thus determine whether there was 1 or 0 stored by the memory cell 200. In a write cycle, the value to be written to the memory cell 200 is received by the IO block. The desired word lines 202 are asserted in response to the select signals output by the word line driver 104 based on the enable signals from the control block 120.

Static noise margin (SNM) is a measure of how well an SRAM cell, such as the SRAM memory cells 200, can maintain its binary state when the SRAM memory cell is perturbed or upset. In other words, SNM is the maximum value of static voltage noise that a SRAM cell can tolerate without changing state. The change in state may corrupt data stored in the SRAM cell.

One example of an SRAM failure is related to the switching of the state of an SRAM cell in a read operation. The read operation of the SRAM cell results in the internal node holding a zero data value to rise up due to the voltage division along the word line driver and pass gate transistor. When the rise is beyond a threshold, it can result in the bit flipping due to regenerative feedback and thus loss of the stored data.

Consider a read zero (0) operation for the SRAM cell 200 shown in FIG. 2 in which a zero data value is to be read from an output node 210a to the BL 203. Correspondingly, a complementary high or one (1) data value would be stored at the output node 210b. Due to the activation of both the lower NMOS transistor 206c and the pass gate transistor 206a, a resistive voltage drop occurs at the output node 210a of the SRAM cell 200.

If the magnitude of the voltage drop at node 210a is sufficiently high to turn on the NMOS transistor 206b, the data 1 stored at the node 210b will drop. Because of the back to back connection of the inverters of the SRAM cell 200, a regenerative action develops and the output node 210a can be pulled high, resulting in the destruction of data stored in the SRAM cell 200. If the word line voltage is reduced, the voltage at the node 210a is also reduced during the read operation.

If the word line voltage is reduced, the voltage at the SRAM output node is also reduced during a read operation. Some conventional methods reduce word line voltage by using a word line suppression circuit, which weakens the pass gate transistors 206a/206b such that the voltage drop thereacross and the voltage drop between the pass gate transistors 206a/206b and their associated driver transistors 206c/206d reduces, thereby increasing the SNM. Accordingly, a memory cell's read operation is improved when the relative level of the word line reduces compared to the bit cell supply voltage VDD. This results in the SNM of the SRAM to be increased and hence provides a more stable read operation.

Figure 4:
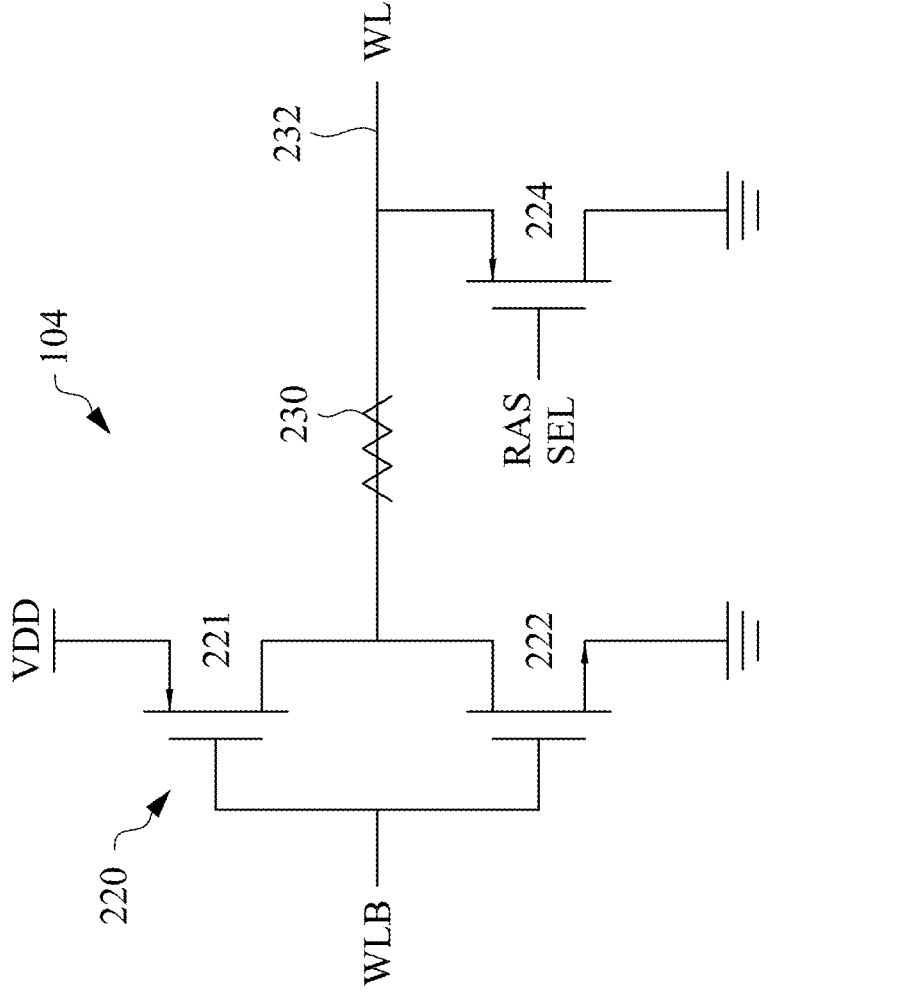
FIG. 4 is a circuit diagram illustrating an example of a word line driver circuit in accordance with some embodiments.

In some embodiments, reduction in word line voltage (i.e. word line suppression) is achieved by a charge sharing arrangement. FIG. 4 illustrates an example of the word line driver 104 in accordance with the present disclosure. The illustrated word line driver 104 includes a PMOS transistor 221 and an NMOS transistor 222 connected as an inverter 220 between the supply voltage terminal VDD and ground. More specifically, a first source/drain terminal of the PMOS transistor 221 is connected to the VDD terminal and a first source/drain terminal of the NMOS transistor 222 is connected to ground. An output node of the inverter 220 is formed at a junction of second source/drain terminals of the PMOS transistor 221 and the NMOS transistor 222.

An enable PMOS transistor 224 is connected between the output of the inverter 220 formed by the transistors 221, 222 and ground. More specifically, a first source/drain terminal of the enable transistor 224 is connected to the output of the inverter 220 and a second source/drain terminal of the enable transistor 224 is connected to ground. Based on the received address signal ADDR (see FIG. 1), a word line bar signal WLB is received at the gate terminals of the transistors 221, 222 (i.e. input of the inverter 220), and a row select signal RAS is received by the enable transistor 224.

Some disclosed embodiments employ a charge sharing arrangement facilitated by the PMOS transistor 221 and the enable PMOS transistor 224 for word line suppression. While some conventional word line suppression circuits reduce word line voltage to improve SNM and operate with a lower cell supply voltage in this manner, SRAM cell operation speed can be impacted. Further, increased power consumption can occur due to a "crow bar" current between the word line driver and the word line suppression activator.

Conventional circuits attempt to address such issues by increasing the size of the enable or pull down transistor 224. For instance, in some embodiments the transistor 224 (and other illustrated transistors) are fin field-effect transistors (FinFETs), which are three-dimensional structures on the surface of a semiconductor substrate. Fins extend upwards from the body of the substrate, and may be formed by depositing fin material on the substrate, etching non-fin areas of the substrate, or a combination thereof. The channel of the FinFET is formed in this vertical fin, and conductive gate strips or "fingers" are provided over (e.g., wrapping) the fin. Wrapping the gate around the fin increases the contact area between the channel region and the gate and allows the gate to control the channel from both sides.

Figure 5:
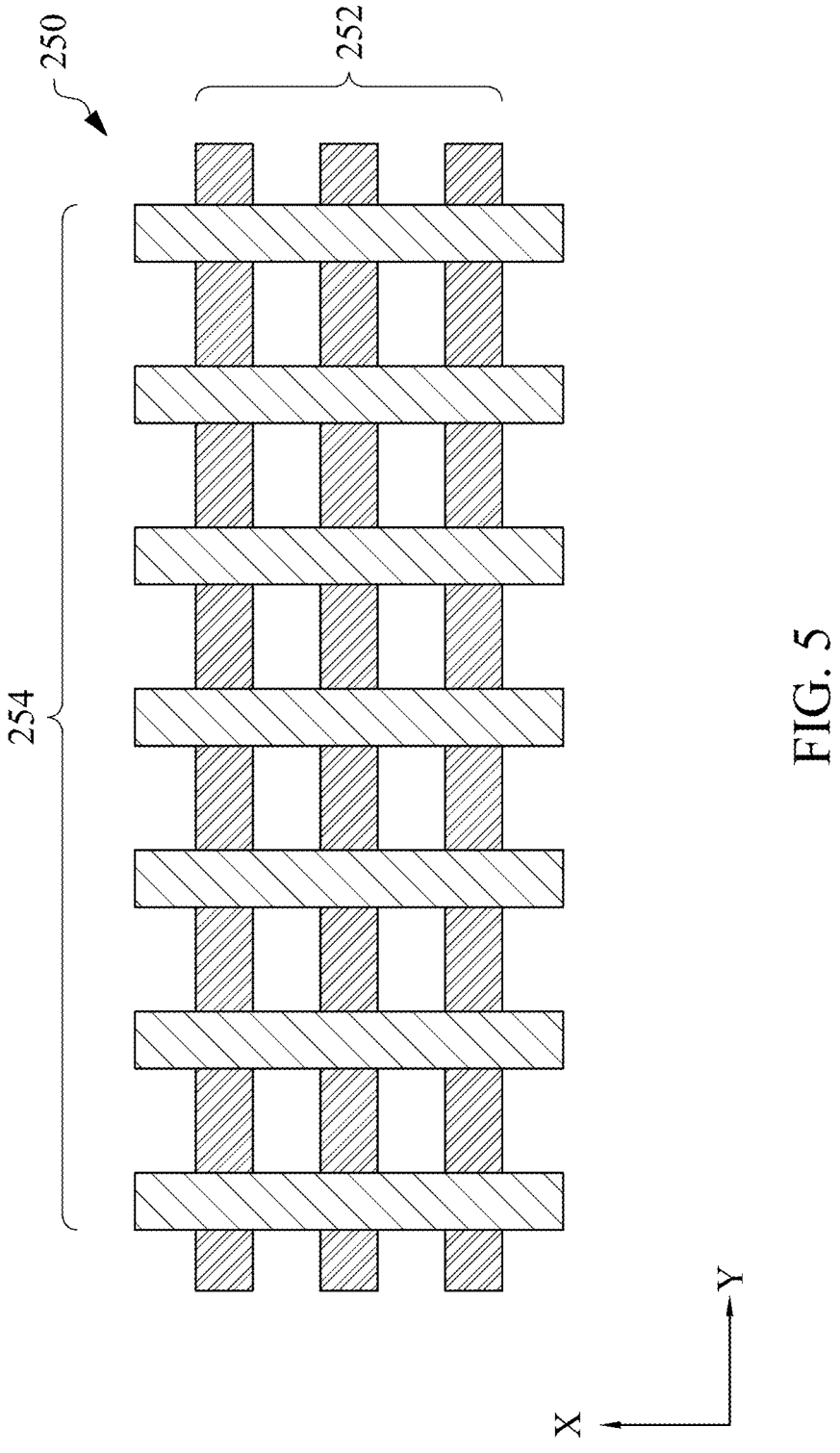
FIG. 5 is a top view illustrating an example of a FinFET structure in accordance with some embodiments.

Increasing the size (i.e. increasing the number of gate fingers) of the enable transistor 224 can result in reducing the word line voltage level. However, this can increase power consumption and also impact the SRAM operation speed. FIG. 5 illustrates an example of portions of a FinFET 250, which could be used to implement the transistor 224. In the illustrated example, the FinFET 250 has three fins 252 extending horizontally (i.e. y direction) and a plurality of gate fingers 254 extending vertically (i.e. x direction). In some known word line suppression arrangements, the enable transistor 224 is implemented with an increased-size FinFET having, for example, 14-20 or more fingers.

Disclosed embodiments provide word line suppression and temperature immunity, while saving power and maintaining SRAM speed. The word line driver 104 shown in FIG. 4 further includes an added resistance 230 formed by increasing the length of a metal line 232 connecting the output of the inverter 220, the enable transistor 224 and the word line 202. The added resistance 230 allows achieving the desired word line suppression while using a smaller FinFET 250 for the enable transistor 224. For instance, in some examples the enable transistor has less than 10 fingers 254, with certain examples having seven fingers 254.

Figure 6:
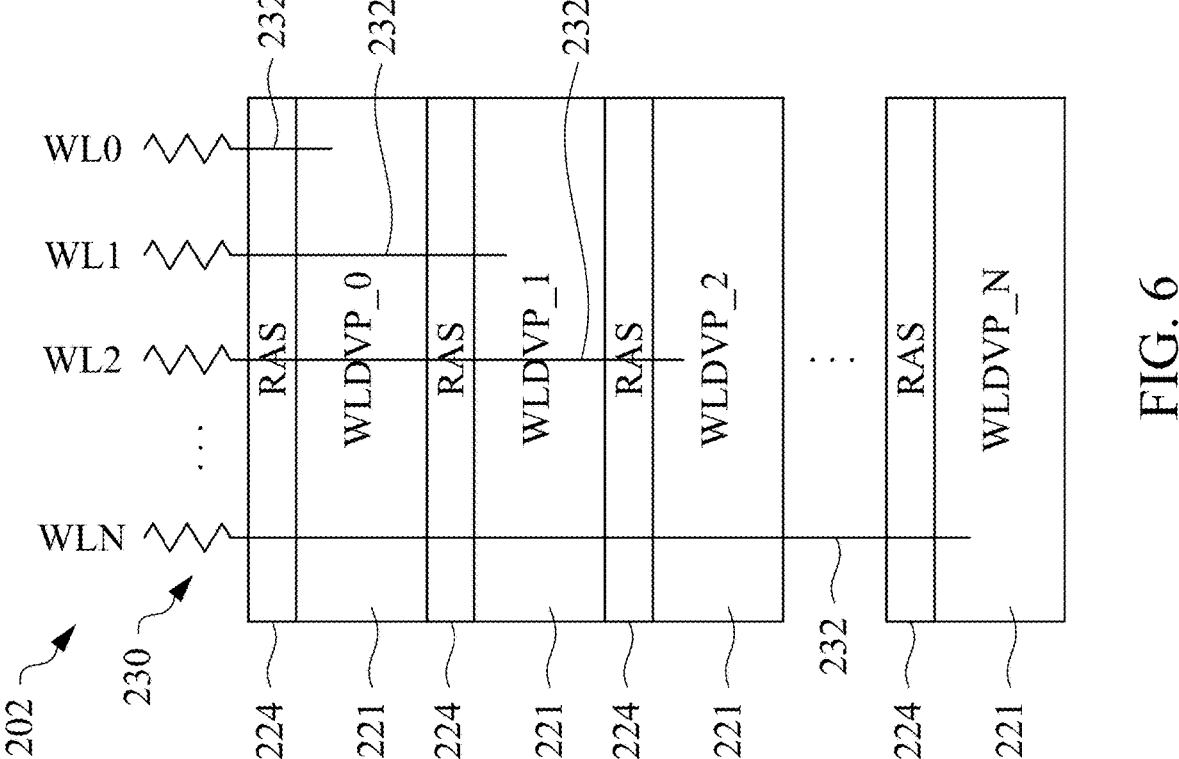
FIG. 6 is a block diagram illustrating aspects of the word line driver circuit in accordance with some embodiments.
Figure 6:

The added resistance 230 is a metal resistance resulting from increasing the length of the metal line connecting the inverter 220 and the enable transistor 224 in some embodiments. The added resistance 230 is 200-400 ohms in some examples depending on temperature (discussed further below). FIG. 6 conceptually illustrates a floor plan for portions of an example the word line driver 104, illustrating a plurality of the word lines 202, including word lines WL0-WLN. FIG. 6 further illustrates the PMOS transistors 221 of the inverter 220, and the enable transistors 224. As will be discussed further below, the conductive metal lines 232 connecting the PMOS transistors 221 and enable transistors 224 have an increased length to provide the added resistance 230. In some examples, the conductive metal lines 232 include various metal layers along with conductive vias. Each of the enable PMOS transistors 224 are positioned near the corresponding PMOS transistor 221. In some examples, the fins 252 forming the enable PMOS transistors 224 are directly adjacent the fins 252 forming the corresponding PMOS transistors 221.

Figure 7:
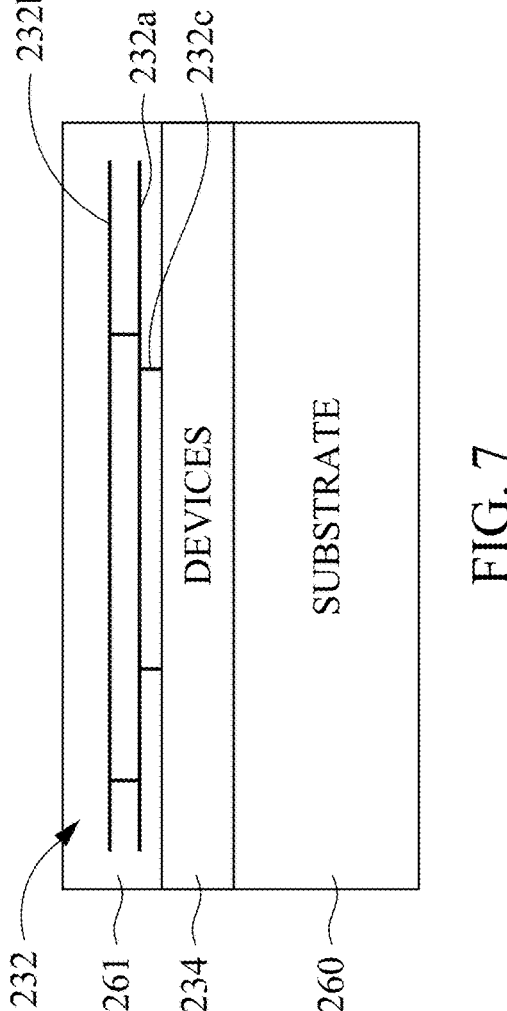
FIG. 7 is a block diagram illustrating an example of a semiconductor device in accordance with some embodiments.

In some examples, the device 100 includes an interconnect structure formed over a substrate. FIG. 7 is a block diagram conceptually illustrating an example of the memory device 100 that includes a substrate 260 with active devices 234, such as the transistors 221, 222 and 224 formed in or on the substrate 260. An interconnect structure 261 is formed over the substrate 260 and devices 234. The interconnect structure 261 may include, for example, various metal layers forming device interconnections, power delivery networks, IO pins, etc. The interconnect structure 261 may include conductive lines and conductive vias interconnecting multiple layers of conductive lines, including the metal depositions, conductive vias, M0-Mn connections, etc., which may be formed over one or more stacked dielectric layers. The conductive lines may comprise copper, aluminum, tungsten, tantalum, titanium, nickel, cobalt, metal silicide, metal nitride, poly silicon, combinations thereof, and/or other materials possibly including one or more layers or linings. The conductive vias may extend through respective ones of the dielectric layers to provide vertical connections between layers of the conductive lines, as well as through the substrate to electrically connect the front side and back side interconnect structures.

The interconnect structure 261 provides the metal lines 232 that interconnect the transistors 221, 222 and 224 as shown in the example of FIG. 4, among other things. In the example shown in FIG. 4, the distance between the word lines 202 and the inverter 220 (i.e. PMOS transistor 221) and corresponding enable transistor 224 varies depending the relative locations of the word lines 202 of the memory array 110 and the PMOS transistors 221 and 224. To increase the length of the metal lines 232 to form the added resistance 230 and provide a consistent length of the metal interconnect lines and in turn provide a consistent added resistance 230, the metal lines 232 may comprise a plurality segments or portions formed by different metal layers and vias of the interconnect structure 261. For instance, the metal lines 232 may include first portions 232a in a first metal layer of the interconnect structure 261, second portions 232b in second metal layer of the interconnect structure 261, and third portions 232c that include one or more vias 236 that interconnect the various metal layers of the interconnect structure 261 and devices 234. By extending the length of the metal connector 232 by including the first, second and third portions 232a, 232b, 232c in different metal layers and vias, the resistance is increased, which lowers the word line signal voltage. The lower word line voltage in turn improves the SRAM cell SNM.

Moreover, to provide a consistent added resistance 230 among the various metal lines 232, the metal lines 232 are constructed using the interconnect structure 261 so as to have similar lengths and thus, consistent resistance 230. As shown in FIG. 6, situating the enable transistors 224 close to their corresponding PMOS transistors 221 further provides for a balanced RC network formed by the metal lines 232.

Figure 8:
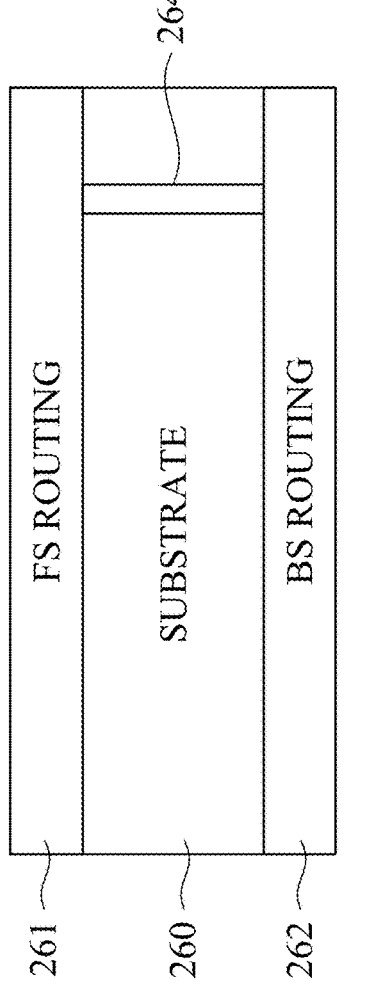
FIG. 8 is a block diagram illustrating another example of a semiconductor device in accordance with embodiments.

FIG. 8 illustrates an example of the memory device 100, which includes the word line driver circuit 104, that includes the substrate 260 having a front side and a back side opposite the front side. In FIG. 8, the interconnect structure 261 is a front side interconnect structure situated on or over the front side of the substrate 260, while a back side interconnect structure 262 is situated on or over the back side of the substrate 260. Inter-layer vias 264 extend through the substrate 260 and electrically connect the front side interconnect structure 261 and the back side interconnect structure 262.

Figure 9:
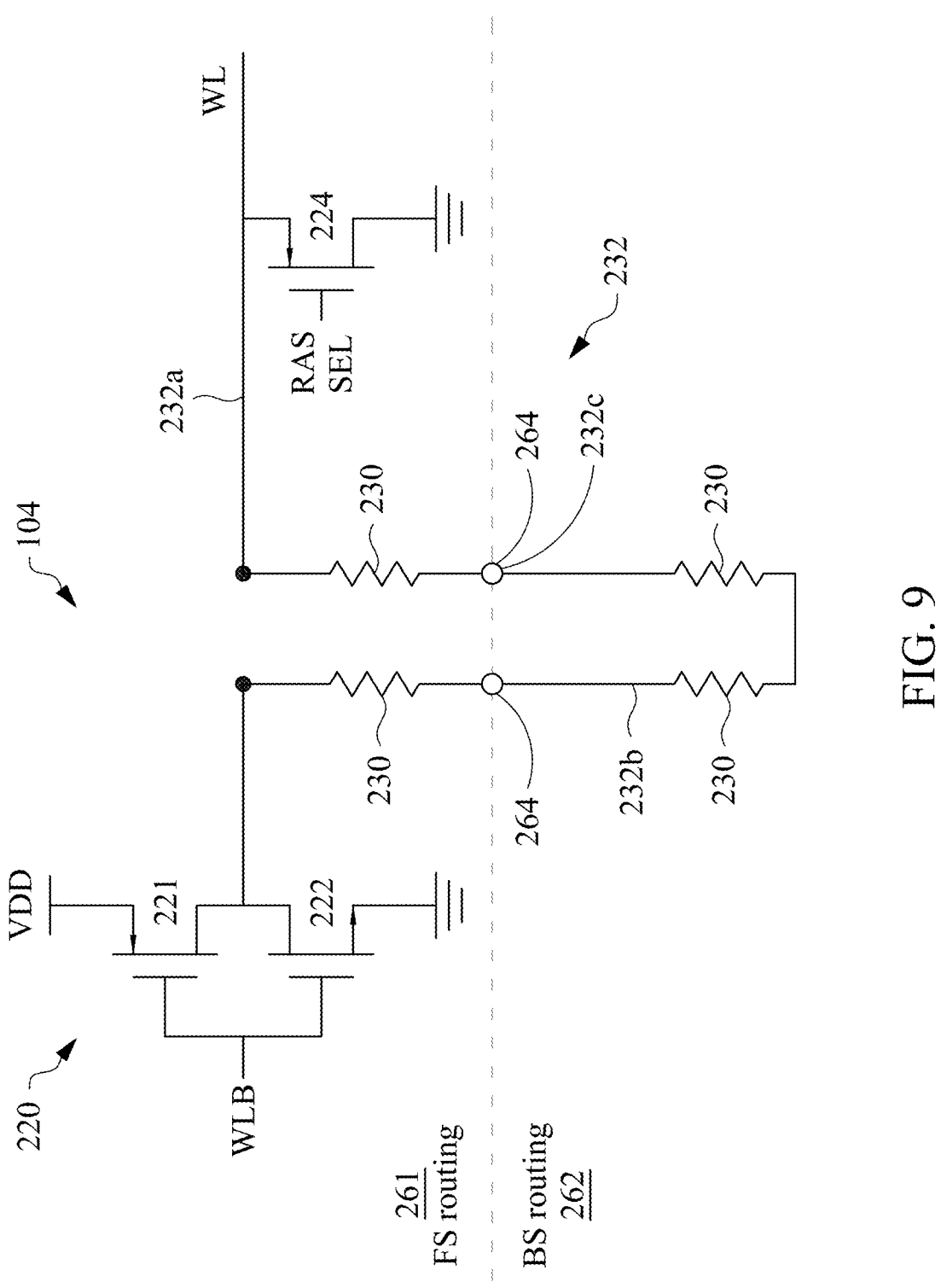
FIG. 9 is a block diagram illustrating another example of the word line driver circuit in accordance with some embodiments.

As discussed above, the word line driver 104 includes the inverter 220 formed by the PMOS transistor 221 and the NMOS transistor 222. The enable PMOS transistor 224 is connected to the output of the inverter 220 by a conductive line, such as the metal line 232 that includes the first portions 232a in the front side interconnect structure 261. In FIG. 9, the second portions 232b are in the back side interconnect structure 262, and the third portions 232c are one or more vias 264 that interconnect the front side interconnect structure 261 and the back side interconnect structure 262. By extending the length of the metal connector 232 by including the first portions 232a in the front side interconnect structure 261, the second portions 232b in the back side interconnect structure 262, and the third portions 232c in the vias 264, the resistance 230 is increased, which lowers the word line signal voltage. The lower word line voltage in turn improves the SRAM cell SNM.

Other embodiments employ three-dimensional integrated circuits (3DICs), in which multiple semiconductor dies are interconnected and packaged together to form an integrated circuit device. In some of these integrated circuit devices, semiconductor dies are arranged edge-to-edge, while others are stacked vertically. Such devices achieve 3D integration at a package level, for example, by stacking separately manufactured chips. A monolithic 3D approach uses two or more device tiers that are fabricated sequentially, with devices formed in respective tiers and connect using through-silicon-vias (TSV).

Figure 10:
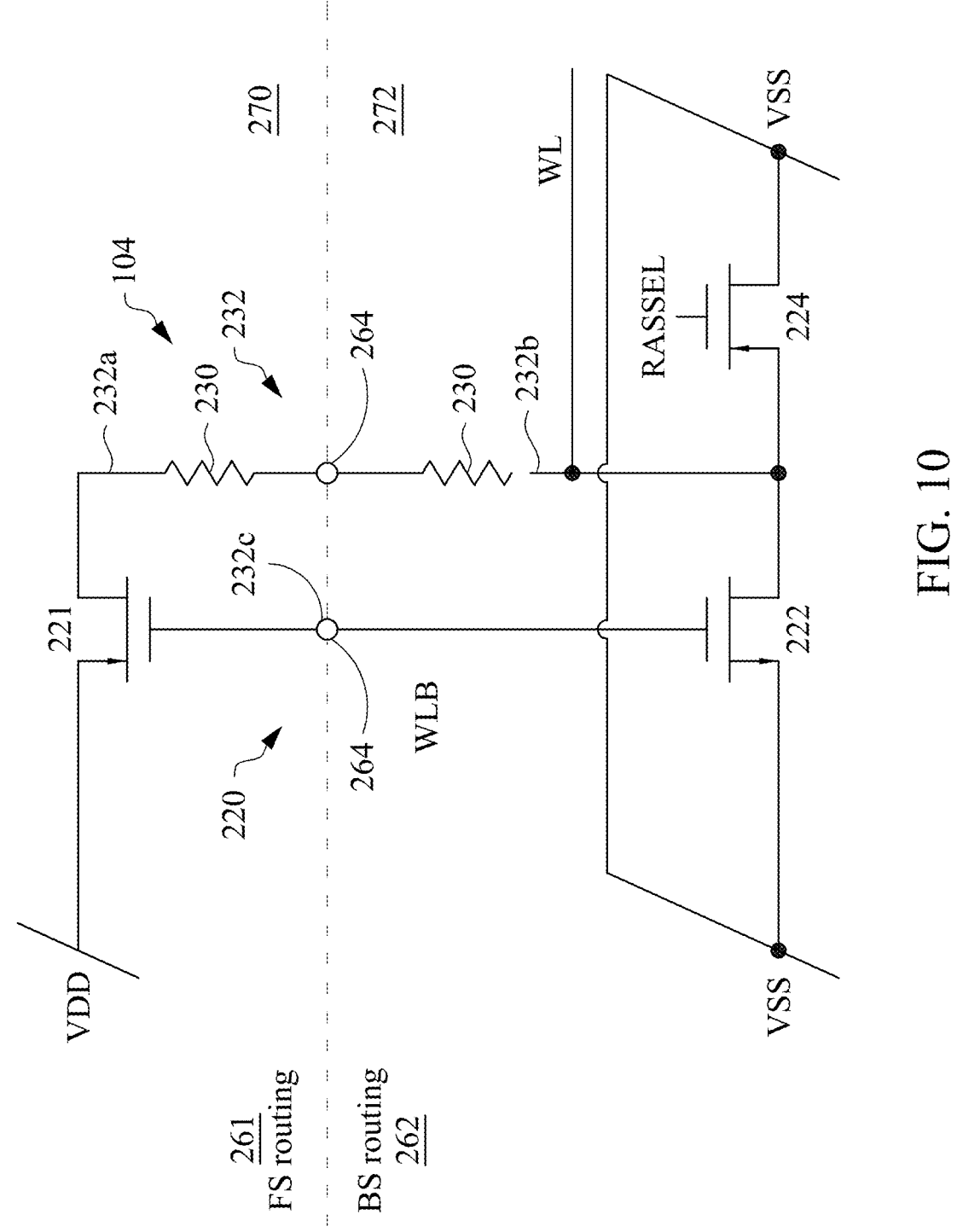
FIG. 10 is a block diagram illustrating another example of the word line driver circuit in accordance with some embodiments.

FIG. 10 illustrates an example of the word line driver circuit 104 formed in a 3DIC device. In some embodiments, multiple semiconductor dies are stacked, with wire-bonding, flip-chip bonding, and/or through-silicon vias (TSV) being used to stack the dies together and to connect the dies to package substrates. Other embodiments employ a monolithic 3DIC structure having multiple tiers. More particularly, monolithic 3D ICs entail two or more levels of devices such as transistors that are sequentially fabricated and interconnected over a substrate. For example, beginning with a first semiconductor substrate, a first level of transistors is fabricated with conventional techniques. A donor substrate is then bonded to the first substrate and a portion of the donor substrate is cleaved off to leave a semiconductor thin film over the first level of transistors. A second level of transistors is then fabricated in the semiconductor thin film and inter-level interconnects are formed between the transistor levels. Thus, monolithic 3DICs may include one or more inter-layer interconnects that extend between a first (e.g., lower) and second (e.g., upper) transistor or device level in the monolithic 3DIC to make vertical connections between tiers of the monolithic 3DIC. Sometimes TSVs are used to implement inter-level interconnects.

The illustrated example includes a first substrate or tier 270 having some active devices (e.g. transistors) of the word line driver circuit 104 and a second substrate or tier 272 having the remainder of the transistors of the word line driver circuit 104. In the example of FIG. 10, the PMOS transistor 221 of the inverter 220 is provided in the first tier 270, while the NMOS transistor 222 of the inverter 220 and the enable transistor PMOS transistor 224 are provided in the second tier 272. The conductive line 232 is again provided by a plurality of interconnect structures, such as the front side interconnect structure 261, the back side interconnect structure 262, and vias 264 to extend the length of the metal connection to increase resistance.

As noted above, the conductive line 230 connecting the inverter 220 and enable transistor 224 has an increased length to increase resistance and in turn, SNL of the SRAM cell 200. Resistance of the metal line varies depending on temperature. For example, resistance of the conductive line 230 is reduced by 10% at a low temperature (e.g. −40 C) as compared to a higher temperature (e.g. 125 C) in some embodiments.

Typically, devices employing larger enable transistors may have SNM failure issues at high temperatures, while memory speed can be reduced at low temperatures. However, the added resistance provided by the increased-length conductive line 232 varies with temperature as noted above. Thus, at low temperatures the added resistance 230 decreases, which increases the word line voltage to improve memory speed.

Thus, using the increased metal resistance 230 by the increased length of the metal lines 232 with a smaller transistor 224 (e.g. fewer gate fingers) provides desired suppression of the word line voltage level. Moreover, changes in the added resistance 230 in response to temperature variations improves speed and performance at low temperatures.

Figure 11:
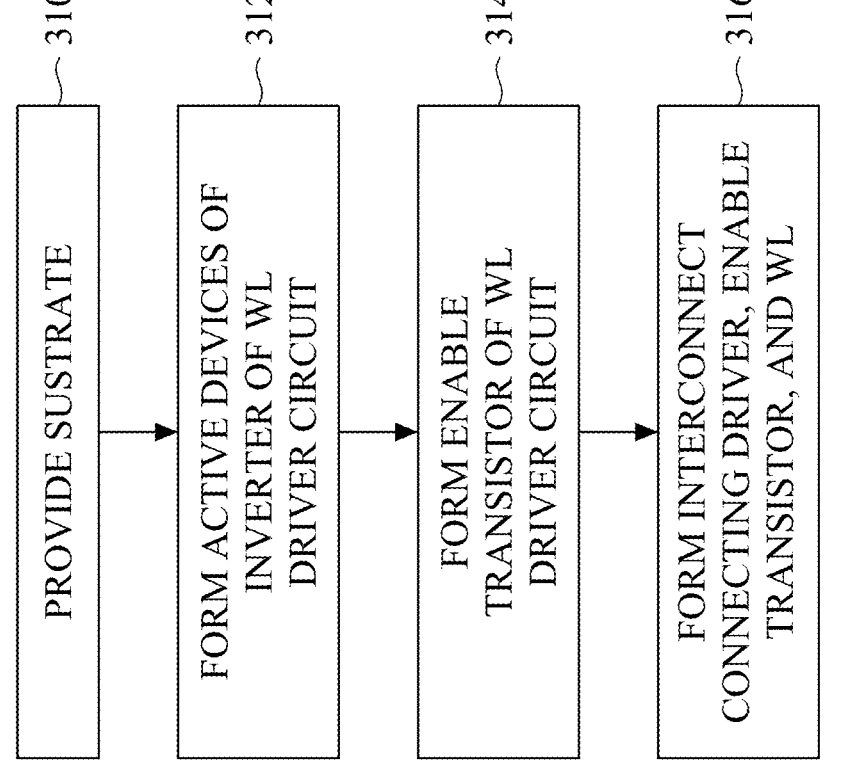
FIG. 11 is a flow diagram illustrating an example of a method in accordance with some embodiments.

FIG. 11 is a flow diagram illustrating an example of a method 300 in accordance with aspects of the present disclosure. Referring to FIG. 11 together with the previous figures discussed above, the method 300 of FIG. 11 includes providing the substrate 260 at an operation 310. The substrate 260 has a front side and a back side opposite the front side. At operation 312, active devices 234 (e.g. transistors 221, 222) of the word line driver circuit 104 are formed in or on the substrate 260. The word line driver circuit 104 is configured to output a word line enable signal to a word line 202 of a memory array 110. As described above, the word line driver circuit 104 includes an inverter circuit 220 with transistors 221 and 222, and an enable transistor 224. The enable transistor 224 is formed in or on the substrate at operation 314.

An interconnect structure 261 is formed on or over the substrate 260 at operation 316. The interconnect structure 261 has a plurality of metal layers 232a, 232b and a via 232c electrically connecting the metal layers. In some examples, the interconnect structure includes a front side interconnect structure 261 formed on or over the front side of the substrate 260 and a back side interconnect structure 262 formed on or over the back side of the substrate 260.

In some examples, operation 316 includes forming an interlayer via 264 extending through the substrate 260 that electrically connects the front side interconnect structure 261 and the back side interconnect structure 262. The inverter circuit 220, the enable transistor 224 and the word line 202 are electrically connected by the metal line 232. As noted above, in some embodiments the metal line 232 is formed with at least a first portion 232a including the first metal layer and a second portion 232b including the second metal layer and a via 232c. In further embodiments, the metal line 232 includes the front side interconnect structure 261, the back side interconnect structure 262 and the interlayer via 264. By forming the metal line 232 in multiple metal layers and/or interconnect structures (i.e. front side and back side interconnect structures), the added metal resistance 230 is included, which improves memory cell SNM to suppress the word line voltage, while also improving performance at high and low temperatures.

Thus, aspects of the present disclosure provide a memory circuit that includes a substrate with a front side and a back side opposite the front side. An interconnect structure is situated on or over the substrate and has first and second metal layers and a via electrically connecting the first and second metal layers. A word line driver circuit is configured to output a word line enable signal to a word line of a memory array. The word line driver circuit has an inverter circuit configured to receive a word line signal, and an enable transistor electrically connected to an output of the inverter circuit by a metal line that includes the first metal layer, the second metal layer, and the via.

In accordance with further disclosed embodiments, a memory device includes a memory array with a plurality of memory cells arranged in rows and columns. A plurality of word lines are connected to the memory cells of respective rows of the memory array. A word line driver circuit is configured to output word line enable signals to respective word lines, and includes a substrate, an interconnect structure situated on or over the substrate, a plurality of inverter circuits and a plurality of enable transistors electrically connected to respective ones of the word lines by metal lines of the interconnect structure. Each of the metal lines has a consistent length.

In accordance with still further disclosed embodiments, a method for forming a memory circuit includes providing a substrate having a front side and a back side opposite the front side. Active devices of a word line driver circuit configured to output a word line enable signal to a word line of a memory array are formed in or on the substrate. The word line driver circuit includes an inverter circuit and an enable transistor. An interlayer via extending through the substrate is formed. A front side interconnect structure is formed on or over a front side of the substrate, and a back side interconnect structure is formed on or over the back side of the substrate. The inverter circuit, the enable transistor and the word line are electrically connected by a metal line that includes the front side interconnect structure, the back side interconnect structure and the interlayer via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate having a front side and a back side opposite the front side;
an interconnect structure situated on or over the substrate, the interconnect structure including first and second metal layers and a via electrically connecting the first and second metal layers; and
a word line driver circuit configured to output a word line enable signal to a word line of a memory array, the word line driver circuit including:
an inverter circuit configured to receive a word line signal, wherein the inverter circuit includes a first PMOS transistor and a first NMOS transistor, and wherein the output of the inverter circuit is formed at a junction of the first PMOS transistor and the first NMOS transistor; and

an enable transistor electrically connected to an output of the inverter circuit by a metal line that includes the first metal layer, the second metal layer, and the via, wherein the enable transistor includes a second PMOS transistor, and wherein the enable transistor is a FinFET.

2. The device of claim 1, wherein the FinFET includes fewer than 10 gate fingers.

3. The device of claim 1, wherein the FinFET includes 7 gate fingers.

4. The device of claim 1, wherein the metal line has a resistance greater than 200 ohms.

5. The device of claim 1, wherein the metal line has a resistance of 200 to 400 ohms.

6. The device of claim 1, wherein the interconnect structure includes a front side interconnect structure situated on or over the front side of the substrate, a back side interconnect structure situated on or over the back side of the substrate, and an interlayer via extending through the substrate and electrically connecting the front side interconnect structure and the back side interconnect structure, and wherein the metal line includes the front side interconnect structure, the back side interconnect structure and the interlayer via.

7. The device of claim 6, further comprising first and second tiers, wherein at least one of the first PMOS transistor, the first NMOS transistor and/or the second PMOS transistor are in the first tier, and wherein at least one of the first PMOS transistor, the first NMOS transistor and/or the second PMOS transistor are in the second tier.

8. A memory device, comprising:
a memory array including a plurality of memory cells arranged in rows and columns, wherein the memory cells are SRAM cells;
a plurality of word lines connected to the memory cells of respective rows of the memory array;
a word line driver circuit configured to output word line enable signals to respective word lines, the word line driver circuit including:
a substrate;
an interconnect structure situated on or over the substrate, wherein the interconnect structure includes a front side interconnect structure situated on or over a front side of the substrate, a back side interconnect structure situated on or over a back side of the substrate opposite the front side, and an interlayer via extending through the substrate and electrically connecting the front side interconnect structure and the back side interconnect structure;
a plurality of inverter circuits and a plurality of enable transistors electrically connected to respective ones of the word lines by metal lines of the interconnect structure, wherein:
the inverter circuits each include a first PMOS transistor and a first NMOS transistor;
the enable transistors each include a second PMOS transistor;
an output of the inverter circuit is formed at a junction of the first PMOS transistor and the first NMOS transistor;
wherein at least one of the first PMOS transistor, the first NMOS transistor and/or the second PMOS transistor are in the first tier, and wherein at least one of the first PMOS transistor, the first NMOS transistor and/or the second PMOS transistor are in the second tier, each of the metal lines has a consistent length, and the metal lines include the front side interconnect structure, the back side interconnect structure and the interlayer via.

9. The memory device of claim 8, wherein the interconnect structure includes first and second metal layers and a via electrically connecting the first and second metal layers, and wherein the metal lines include the first metal layer, the second metal layer, and the via.

10. A method, comprising:

providing a substrate having a front side and a back side opposite the front side;

forming active devices of a word line driver circuit configured to output a word line enable signal to a word line of a memory array in or on the substrate, the word line driver circuit including an inverter circuit and an enable transistor, wherein the active devices of the inverter circuit include a first PMOS transistor and a first NMOS transistor, wherein the enable transistor includes a PMOS transistor, and wherein the enable transistor is a FinFET having fewer than 10 fingers;

forming a metal line electrically connecting the inverter circuit, the enable transistor and the word line, wherein forming the metal line includes:

forming an interlayer via extending through the substrate;

forming a front side interconnect structure on or over the front side of the substrate; and forming a back side interconnect structure on or over the back side of the substrate, such that the metal line electrically connecting the inverter circuit, the enable transistor and the word line includes the front side interconnect structure, the back side interconnect structure and the interlayer via.

11. The method of claim 10, wherein forming the front side interconnect structure includes forming first and second metal layers and a via electrically connecting the first and second metal layers, wherein the metal line includes the first and second metal layers and the via.

12. The method of claim 10, wherein providing the substrate includes providing a substrate having first and second tiers, wherein at least one of the first PMOS transistor, the first NMOS transistor and/or the second PMOS transistor are in the first tier, and wherein at least one of the first PMOS transistor, the first NMOS transistor and/or the second PMOS transistor are in the second tier.

13. The memory device of claim 8, wherein the enable transistor is a FinFET.

14. The memory device of claim 13, wherein the FinFET includes fewer than 10 gate fingers.

15. The memory device of claim 13, wherein the FinFET includes 7 gate fingers.

16. The memory device of claim 8, wherein the metal lines each have a resistance greater than 200 ohms.

17. The memory device of claim 8, wherein the metal lines each have a resistance of 200 to 400 ohms.

18. The method of claim 8, wherein the metal line has a resistance greater than 200 ohms.

19. The method of claim 8, wherein the metal line has a resistance of 200 to 400 ohms.

20. The method of claim 8, wherein the memory array includes SRAM cells.

* * * * *